United States Patent [19]

Etheridge

[11] Patent Number: 4,891,535
[45] Date of Patent: Jan. 2, 1990

[54] SINGLE SUPPLY ECL TO CMOS CONVERTER

[75] Inventor: Eric P. Etheridge, Beaverton, Oreg.

[73] Assignee: Tektronix, Inc., Beaverton, Oreg.

[21] Appl. No.: 287,826

[22] Filed: Dec. 20, 1988

[51] Int. Cl.[4] ................. H03K 19/092; H03K 19/086; H03K 17/10; H03K 3/013

[52] U.S. Cl. .................................. 307/475; 307/296.1; 307/356; 307/358; 307/455; 323/314

[58] Field of Search ............... 307/475, 455, 264, 355, 307/356, 358, 363, 448, 446, 443, 542, 544, 546, 547, 575, 576, 579, 585, 570, 451, 473, 296.1, 296.3, 296.6; 323/314

[56] References Cited

U.S. PATENT DOCUMENTS

| | | | |
|---|---|---|---|
| 4,539,551 | 9/1985 | Fujita et al. | 307/362 X |
| 4,700,087 | 10/1987 | Stroberger | 307/455 X |
| 4,727,265 | 2/1988 | Nanbu et al. | 307/475 X |
| 4,761,567 | 8/1988 | Walters, Jr. et al. | 307/475 X |
| 4,810,908 | 3/1989 | Suzuki et al. | 307/475 X |
| 4,849,659 | 7/1989 | West | 307/455 |

OTHER PUBLICATIONS

"Fast CMOS ECL Receivers With 100-mv Worst-Case Sensitivity" (Chappell et al.), IEEE Journal of Solid-State Circuits, vol. 23, No. 1, Feb. 1988.
"A 140 Mbit/s CMOS LSI Framer Chip for a Broad-Bank ISDN Local Access System" (Author: Chao et al.), IEEE Journal of Solid State Circuits, vol. 23, No. 1 (2/88).

Primary Examiner—Stanley D. Miller
Assistant Examiner—David R. Bertelson
Attorney, Agent, or Firm—Peter J. Meza

[57] ABSTRACT

An ECL to CMOS converter having a diferential ECL clock input and an ECL data input is provided. A reference voltage is generated by averaging the level shifted differential ECL clock signals using a voltage divider. This reference voltage and the level shifted ECL data input are compared by a CMOS comparator to provide a CMOS data output. The level shifters, comparators, and the voltage divider are integrated in a standard VLSI CMOS process that enables the resultant integrated circuit to operate from a single supply voltage.

2 Claims, 1 Drawing Sheet

SINGLE SUPPLY ECL TO CMOS CONVERTER

BACKGROUND OF THE INVENTION

The present invention relates in general to ECL to CMOS converters and, more particularly, to single supply ECL to CMOS converters capable of being integrated in a single chip using a standard VLSI CMOS process.

Conversion from the logic levels of one logic family to another logic family is well known in the art. A prior art circuit which is used to convert ECL logic levels to CMOS logic levels is shown in FIG. 1. The converter 10 provides conversion for both the data (ECL DATA INPUT) and the clock (ECL CLOCK and ECL $\overline{\text{CLOCK}}$). The ECL data is converted by being level shifted and compared to a reference voltage. The reference voltage (BANDGAP REFERENCE VOLTAGE) is provided by an external bipolar circuit. The level shifters 12 and 14 provide a four volt positive level shift to enable the CMOS comparator 20 to compare the two levels and provide a CMOS compatible output (CMOS DATA OUTPUT). The clock conversion is provided in a similar manner, using levels shifters 16 and 18, and CMOS comparator 22. In the special case of clock conversion, no external bandgap reference voltage is needed, since alternating phases of the clock signal provide the reference for the comparison.

Typically, the level shifters 12, 14, 16, and 18 are zener diodes and are external to the integrated circuit which contains CMOS comparators 20 and 22 as well as other CMOS circuitry. Although CMOS circuits usually operate using a positive five volt supply and ground, the external bandgap reference voltage circuit provides a negative voltage, and therefore requires an additional negative supply.

What is desired is a CMOS to ECL converter in which the bandgap reference voltage circuit is eliminated and the level shifting circuits are fabricated in a VLSI CMOS process, enabling the entire converter to be integrated with other CMOS circuitry on a single chip powered by a single supply voltage.

SUMMARY OF THE INVENTION

This invention provides an ECL to CMOS converter having a differential ECL clock input and an ECL data input. A reference voltage is generated by averaging the level shifted differential ECL clock signals using a voltage divider. This reference voltage and the level shifted ECL data input are compared by a CMOS comparator to provide a CMOS data output. All level shifters, comparators, and the voltage divider may be integrated in a standard VLSI CMOS process which enables the resultant integrated circuit to operate from a single supply voltage.

DESCRIPTION OF THE PREFERRED EMBODIMENT

Figure 1:
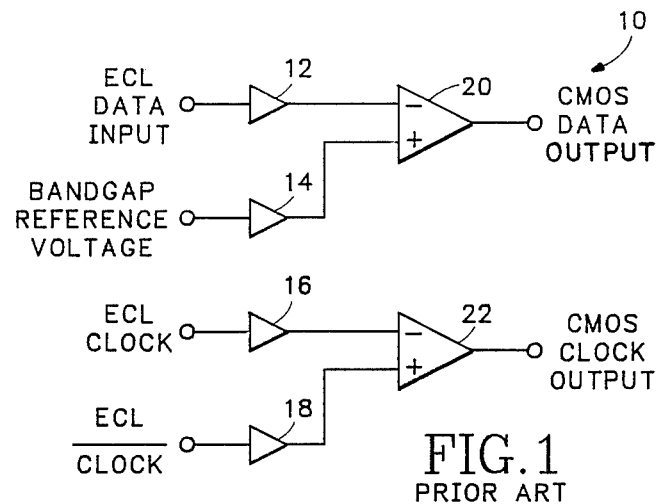
FIG. 1 is a schematic diagram of a prior art ECL to CMOS converter.
Figure 2:
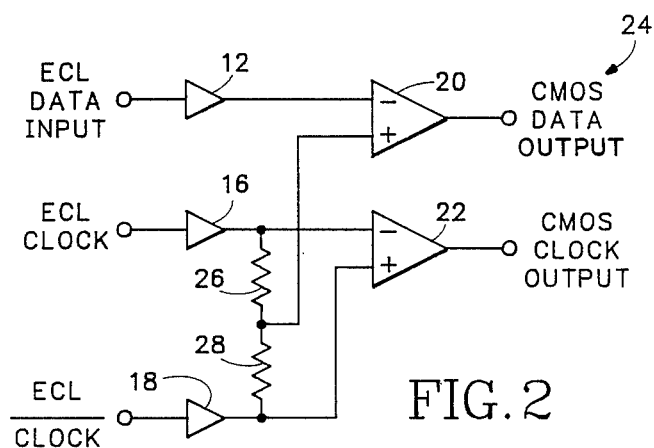
FIG. 2 is a schematic diagram of an ECL to CMOS converter according to the present invention.

The circuit which is used to convert ECL logic levels to CMOS logic levels according to the present invention is shown in FIG. 2. The converter 24 provides conversion for both the data (ECL DATA INPUT) and the clock (ECL CLOCK and ECL $\overline{\text{CLOCK}}$). The level shifters 16 and 18 provide a four volt positive level shift to enable the CMOS comparator 22 to compare the two level shifted clock signals to provide a CMOS compatible clock (CMOS CLOCK OUTPUT). Alternating phases of the clock signal provide the reference for the comparison by comparator 22. The alternating phases of the clock signal also provide inputs to a voltage divider circuit consisting of resistors 26 and 28. The output of the voltage divider provides a reference voltage which is at a midpoint between the level shifted ECL high voltage value and level shifted ECL low voltage value.

Once the reference voltage has been generated, the CMOS data can be generated. The ECL data is level shifted four volts positive by level shifter 12. This shifted data is compared with the generated reference voltage by CMOS comparator 20. The resultant data output (CMOS DATA OUTPUT) provides a CMOS compatible data signal. The generated reference voltage may also be used throughout an integrated circuit for multiple ECL data inputs. Using this generated reference voltage throughout the integrated circuit will improve overall noise immunity.

In order that the ECL to CMOS converter according to the present invention may be fabricated into a single integrated circuit, it is desirable that the voltage divider comprised of resistors 26 and 28, the comparators 20 and 22, and the level shifting circuits 12, 16, and 18 be fabricated using a standard VLSI CMOS process. Therefore, resistors 26 and 28 should ideally be built using a pair of integrated circuit resistors such as N well, P well, or polysilicon. The comparators 20 and 22 should be built using standard N and P channel CMOS transistors. The design of the comparator is chosen to conform to the operating specifications of the converter 24 or of the integrated circuit of which the converter 24 is a part.

Figure 3:
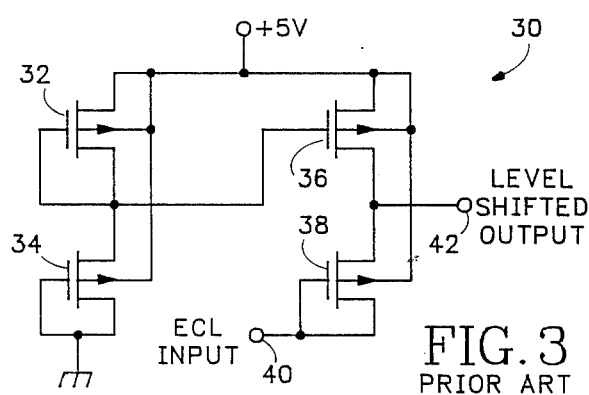
FIG. 3 is a schematic diagram of a level shifting circuit particularly suited for use in the present invention.

In order to operate the ECL to CMOS converter from a sole power supply, level shifting circuits 12, 16, and 18 should preferably be of the type shown in FIG. 3 which is known in the art. The level shifter shown consists of four P channel CMOS transistors 32, 34, 36, and 38. Transistors 32 and 34 form a resistance divider that generates a bias voltage for biasing the gate of transistor 36. Transistor 36 is thus biased in the saturation region which produces a corresponding constant drain current. The gate and drain of transistor 38 are coupled together in a "diode-connected" fashion that, in conjunction with the drain current of transistor 36, creates the positive four volt level shift between the ECL INPUT at terminal 40 and the LEVEL SHIFTED OUTPUT at 42. It is important to note that while terminal 40 is coupled to ECL level voltages (approximately −1.8 to −1 volts), the level shifter may be integrated in a standard CMOS process operating between ground and a five volt supply. At most, no more than five volts will appear between the source and drain of any transistor in the circuit, and only eight volts will appear across the source or drain to N well or substrate junction. These voltages are within the range in which an integrated CMOS circuit reliably operates. If desired, for greater power supply stability an additional diode-connected P-channel transistor may be added between the source of transistor 32 and the five volt supply.

Thus an ECL to CMOS converter according to the present invention may be constructed without a separate bandgap voltage reference or without external level shifters. The ECL to CMOS converter according to the present invention may be fabricated using a standard CMOS process in a single integrated circuit powered by a single five volt supply.

While the invention has been particularly shown and described with reference to a preferred embodiment thereof, it will be understood by those skilled in the art that changes in form and detail may be made therein without departing from the spirit and scope of the invention.

I claim:

1. A single supply ECL to CMOS converter comprising:
   (a) means for shifting ECL data to produce a shifted output;
   (b) means for shifting an ECL clock to produce a first output;
   (c) means for shifting an inverted ECL clock to produce a second output;
   (d) means for generating a reference output from the first and second outputs; and
   (e) means for comparing the shifted output with the reference output to produce CMOS output data.

2. A single supply ECL to CMOS converter as in claim 1 wherein the means for generating a reference output comprises first and second resistors having one end coupled together to form the reference output, the other end of each resistor each respectively receiving the first and second outputs.

* * * * *